US009059665B2

(12) United States Patent
Youssef et al.

(10) Patent No.: US 9,059,665 B2
(45) Date of Patent: Jun. 16, 2015

(54) AMPLIFIERS WITH MULTIPLE OUTPUTS AND CONFIGURABLE DEGENERATION INDUCTOR

(71) Applicant: QUALCOMM Incorporated, San Diego, CA (US)

(72) Inventors: Ahmed A. Youssef, San Diego, CA (US); Li-Chung Chang, Irvine, CA (US)

(73) Assignee: Qualcomm Incorporated, San Diego, CA (US)

( * ) Notice: Subject to any disclaimer, the term of this patent is extended or adjusted under 35 U.S.C. 154(b) by 76 days.

(21) Appl. No.: 13/775,036

(22) Filed: Feb. 22, 2013

(65) Prior Publication Data

US 2014/0240048 A1    Aug. 28, 2014

(51) Int. Cl.
*H03F 3/04* (2006.01)
*H03F 3/16* (2006.01)
(Continued)

(52) U.S. Cl.
CPC ............ *H03F 3/16* (2013.01); *H03F 2200/372* (2013.01); *H03G 1/0052* (2013.01);
(Continued)

(58) Field of Classification Search
CPC ................ H03F 2200/294; H03F 2203/45638; H03F 3/45475; H03F 3/45179; H03F 2200/372; H03F 2200/451; H03F 2203/45386; H03F 3/45183; H03F 3/19; H03F 1/56; H03F 2203/45464; H03F 3/245; H03F 1/223
USPC ........... 330/98, 133, 150, 252, 253, 282, 296, 330/301, 310
See application file for complete search history.

(56) References Cited

U.S. PATENT DOCUMENTS 6,498,926 B1 * 12/2002 Ciccarelli et al. .......... 455/240.1
7,352,241 B2    4/2008 Lee
(Continued)

FOREIGN PATENT DOCUMENTS

EP          2456068 A1     5/2012
JP       2003324343 A     11/2003
(Continued)

OTHER PUBLICATIONS

Feng L., et al., "Overlapped Inductors and Its Application on a Shared RF Front-end in a MultiStandard IC," 2011 IEEE Custom Integrated Circuits Conference (CICC), Sep. 2011, IEEE, Piscataway, NJ, pp. 1-4.

(Continued)

*Primary Examiner* — Khanh V Nguyen
(74) *Attorney, Agent, or Firm* — Toler Law Group, PC

(57) ABSTRACT

Multi-output amplifiers with configurable source degeneration inductance and having good performance are disclosed. In an exemplary design, an apparatus (e.g., a wireless device or an integrated circuit) includes a gain transistor and a configurable degeneration inductor for an amplifier. The gain transistor receives an input signal and provides an amplified signal. The amplifier provides a single output signal in a first operating mode or a plurality of output signals in a second operating mode. The configurable degeneration inductor is coupled to the gain transistor and provides a first source degeneration inductance in the first operating mode or a second source degeneration inductance in the second operating mode. The second source degeneration inductance is less than the first source degeneration inductance and may be dependent on the number of output signals generated in the second operating mode.

20 Claims, 10 Drawing Sheets

(51) Int. Cl.
*H03F 1/22* (2006.01)
*H03F 3/193* (2006.01)
*H03F 3/24* (2006.01)
*H03F 3/68* (2006.01)
*H03F 3/72* (2006.01)
*H03G 1/00* (2006.01)

(52) U.S. Cl.
CPC ............... *H03F 1/223* (2013.01); *H03F 3/193* (2013.01); *H03F 3/245* (2013.01); *H03F 3/68* (2013.01); *H03F 3/72* (2013.01); *H03F 2200/111* (2013.01); *H03F 2200/294* (2013.01); *H03F 2200/451* (2013.01); *H03F 2200/489* (2013.01); *H03F 2200/541* (2013.01)

(56) References Cited

U.S. PATENT DOCUMENTS

| | | | |
|---|---|---|---|
| 7,443,241 B2 | 10/2008 | Fong et al. | |
| 7,463,093 B2 | 12/2008 | Taylor et al. | |
| 7,482,879 B2 | 1/2009 | Koutani et al. | |
| 8,022,772 B2 | 9/2011 | Cassia et al. | |
| 8,031,005 B2 | 10/2011 | Xiong et al. | |
| 8,102,213 B2 | 1/2012 | Tasic et al. | |
| 8,175,566 B2 | 5/2012 | Tasic et al. | |
| 8,378,748 B2 * | 2/2013 | Heikkinen et al. | 330/260 |
| 2006/0119435 A1 | 6/2006 | Oh et al. | |
| 2009/0036065 A1 | 2/2009 | Siu | |
| 2010/0188154 A1 | 7/2010 | Yeung et al. | |
| 2012/0021697 A1 | 1/2012 | Yang | |
| 2012/0105157 A1 | 5/2012 | Ahn et al. | |

FOREIGN PATENT DOCUMENTS

| | | |
|---|---|---|
| WO | 2007085866 A1 | 8/2007 |
| WO | 2011019850 A1 | 2/2011 |
| WO | 2012069231 A1 | 5/2012 |

OTHER PUBLICATIONS

International Search Report and Written Opinion for International Application No. PCT/US2014/015560, ISAEPO, Date of Mailing Mar. 25, 2014. 13 pages.

International Search Report and Written Opinion for International Application No. PCT/US2014/012524, ISA/EPO, Date of Mailing Jul. 28, 2014, 13 pages.

* cited by examiner

AMPLIFIERS WITH MULTIPLE OUTPUTS AND CONFIGURABLE DEGENERATION INDUCTOR

BACKGROUND

I. Field

The present disclosure relates generally to electronics, and more specifically to amplifiers.

II. Background

A wireless device (e.g., a cellular phone or a smartphone) in a wireless communication system may transmit and receive data for two-way communication. The wireless device may include a transmitter for data transmission and a receiver for data reception. For data transmission, the transmitter may modulate a radio frequency (RF) carrier signal with data to obtain a modulated signal, amplify the modulated signal to obtain an output RF signal having the proper transmit power level, and transmit the output RF signal via an antenna to a base station. For data reception, the receiver may obtain a received RF signal via the antenna and may amplify and process the received RF signal to recover data sent by the base station.

A wireless device may support carrier aggregation, which is simultaneous operation on multiple carriers. A carrier may refer to a range of frequencies used for communication and may be associated with certain characteristics. For example, a carrier may be associated with system information describing operation on the carrier. A carrier may also be referred to as a component carrier (CC), a frequency channel, a cell, etc. It is desirable to efficiently support carrier aggregation by the wireless device.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Multi-output amplifiers with configurable source degeneration inductance and having improved performance are disclosed herein. These amplifiers may be used to receive multiple transmitted signals sent concurrently to a wireless device, e.g., for carrier aggregation. These amplifiers may also be used for various electronic devices such as wireless communication devices (e.g., cellular phones, smartphones, etc.), tablets, personal digital assistants (PDAs), handheld devices, wireless modems, laptop computers, smartbooks, netbooks, cordless phones, wireless local loop (WLL) stations, Bluetooth devices, consumer electronic devices, etc. For clarity, the use of amplifiers with configurable source degeneration inductance in a wireless communication device is described below.

Figure 1:
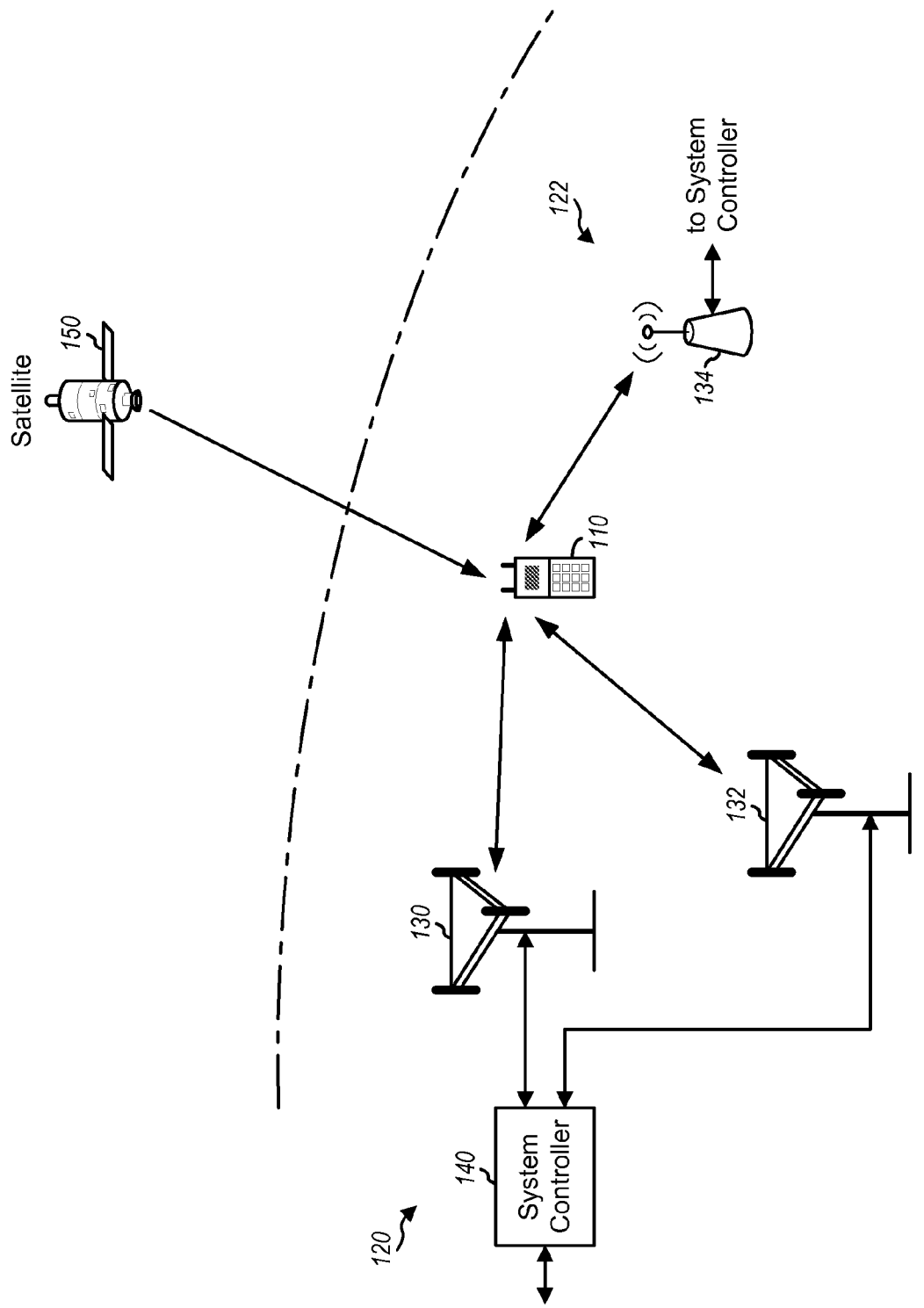
FIG. 1 shows a wireless device communicating with wireless systems.

FIG. 1 shows a wireless device 110 communicating with wireless communication systems 120 and 122. Each wireless system may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1X, Time Division Synchronous CDMA (TD-SCDMA), or some other version of CDMA. For simplicity, FIG. 1 shows wireless system 120 including two base stations 130 and 132 and one system controller 140, and wireless system 122 including one base station 134. In general, a wireless system may include any number of base stations and any set of network entities. A base station may also be referred to as a Node B, an evolved Node B (eNB), an access point, etc.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless system 120 and/or 122. Wireless device 110 may also receive signals from broadcast stations, signals from satellites (e.g., a satellite 150) in one or more global navigation satellite systems (GNSS), etc. Wireless device 110 may support one or more radio technologies for wireless communication such as LTE, WCDMA, CDMA 1X, TD-SCDMA, GSM, 802.11, etc.

Wireless device 110 may be able to operate in low-band (LB) covering frequencies lower than 1000 megahertz (MHz), mid-band (MB) covering frequencies from 1000 MHz to 2300 MHz, and/or high-band (HB) covering frequencies higher than 2300 MHz. For example, low-band may cover 698 to 960 MHz, mid-band may cover 1475 to 2170 MHz, and high-band may cover 2300 to 2690 MHz and 3400 to 3800 MHz. Low-band, mid-band, and high-band refer to three groups of bands (or band groups), with each band group including a number of frequency bands (or simply, "bands"). Each band may cover up to 200 MHz. LTE Release 11 supports 35 bands, which are referred to as LTE/UMTS bands and are listed in a publicly available document 3GPP TS 36.101. In general, any number of band groups may be defined. Each band group may cover any range of frequencies, which may or may not match any of the frequency ranges given above. Each band group may include any number of bands.

Wireless device 110 may support carrier aggregation, which is operation on multiple carriers. Carrier aggregation may also be referred to as multi-carrier operation. A carrier may refer to a range of frequencies used for communication and may be associated with certain characteristics. For example, a carrier may be associated with system information and/or control information describing operation on the carrier. A carrier may also be referred to as a component carrier (CC), a frequency channel, a cell, etc. A band may include one or more carriers. Each carrier may cover up to 20 MHz in LTE. Wireless device 110 may be configured with up to 5 carriers in one or two bands in LTE Release 11.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2:
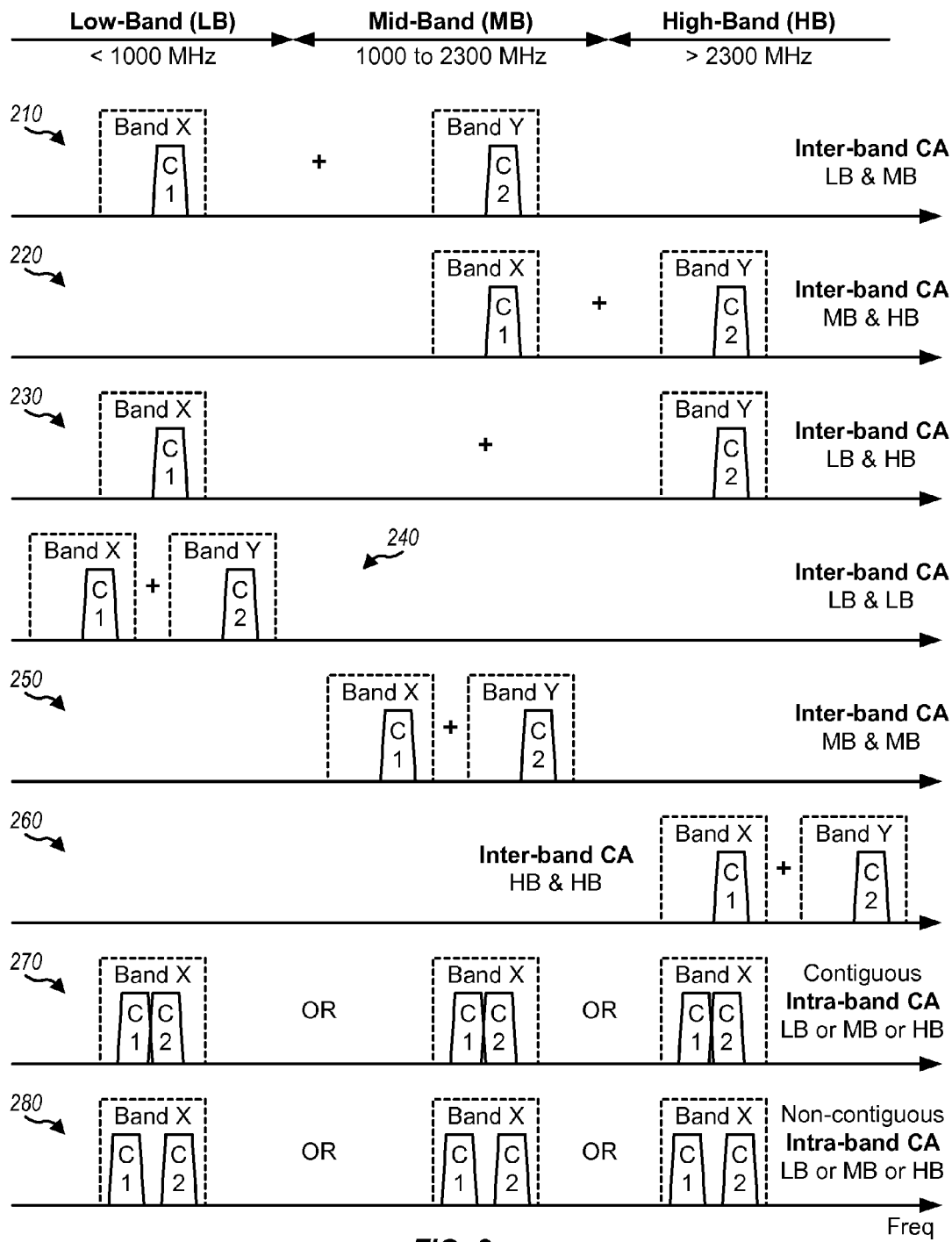
FIG. 2 shows various examples of carrier aggregation (CA).

FIG. 2 shows various CA scenarios that may be supported by wireless device 110. For simplicity, FIG. 2 shows wireless device 110 being configured with only one carrier in a band for inter-band CA. In general, wireless device 110 may be configured with one or more carriers in a given band.

Scenario 210 covers inter-band CA with one carrier C1 in band X in low-band and one carrier C2 in band Y in mid-band being configured for wireless device 110. Scenario 220 covers inter-band CA with one carrier C1 in band X in mid-band and one carrier C2 in band Y in high-band being configured for wireless device 110. Scenario 230 covers inter-band CA with one carrier C1 in band X in low-band and one carrier C2 in band Y in high-band being configured for wireless device 110.

Scenario 240 covers inter-band CA with one carrier C1 in band X in low-band and one carrier C2 in band Y also in low-band being configured for wireless device 110. Scenario 250 covers inter-band CA with one carrier C1 in band X in mid-band and one carrier C2 in band Y also in mid-band being configured for wireless device 110. Scenario 260 covers inter-band CA with one carrier C1 in band X in high-band and one carrier C2 in band Y also in high-band being configured for wireless device 110.

Scenario 270 covers contiguous intra-band CA with two adjacent carriers C1 and C2 in band X in low-band, or mid-band, or high-band being configured for wireless device 110. Scenario 280 covers non-contiguous intra-band CA with two non-adjacent carriers C1 and C2 in band X in low-band, or mid-band, or high-band being configured for wireless device 110.

FIG. 2 shows some examples of carrier aggregation. Carrier aggregation may also be supported for other combinations of bands and band groups.

Wireless device 110 may concurrently receive multiple transmitted signals at different frequencies. These multiple transmitted signals may be sent by one or more base stations on multiple carriers at different frequencies for carrier aggregation. These multiple transmitted signals may also be sent by different base stations for coordinated multi-point (CoMP) transmission, handover, etc. These multiple transmitted signals may also be sent by base stations in different wireless systems for concurrent services such as voice/data, or data/data, or voice/voice, etc. For example, wireless device 110 may support dual SIM/dual standby (DSDS) and/or dual SIM/dual-active (DSDA) and may be able to concurrently communicate with multiple wireless systems such as TD-SCDMA and GSM systems, or LTE and GSM systems, or CDMA and GSM systems, etc.

Figure 3:
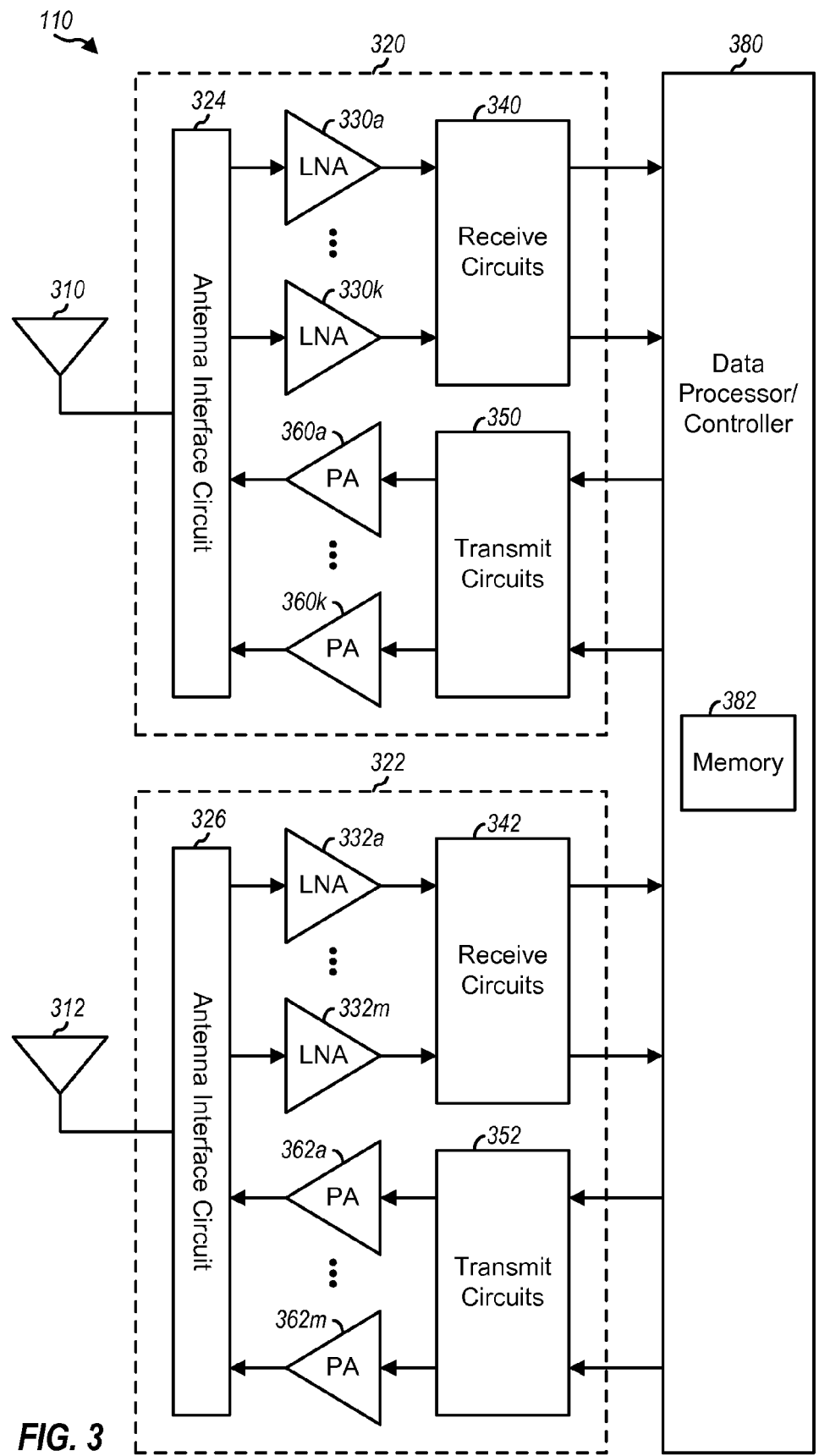
FIG. 3 shows a block diagram of the wireless device in FIG. 1.

FIG. 3 shows a block diagram of an exemplary design of wireless device 110 in FIG. 1. In this exemplary design, wireless device 110 includes a transceiver 320 coupled to a primary antenna 310, a transceiver 322 coupled to a secondary antenna 312, and a data processor/controller 380. Transceiver 320 includes an antenna interface circuit 324, multiple (K) LNAs 330a to 330k, receive circuits 340, transmit circuits 350, and K power amplifiers (PAs) 360a to 360k. Transceiver 322 includes an antenna interface circuit 326, multiple (M) LNAs 332a to 332m, receive circuits 342, transmit circuits 352, and M PAs 362a to 362m. Transceivers 320 and 322 may support multiple frequency bands, carrier aggregation, multiple radio technologies, multiple wireless systems, receive diversity, MIMO transmission from multiple transmit antennas to multiple receive antennas, etc., or any combination thereof.

For data reception, antenna 310 receives signals from base stations and/or other transmitter stations and provides a received RF signal to antenna interface circuit 324, which provides one or more input RF signals to one or more selected LNAs 330. For example, antenna interface circuit 324 may provide (i) one input RF signal to one selected LNA for intra-band CA, with the input RF signal comprising multiple transmitted signals on multiple carriers in the same band, or (ii) two input RF signals for two bands to two LNAs for inter-band CA. Antenna interface circuit 324 may include switches, duplexers, diplexers, transmit filters, receive filters, matching circuits, etc. Each selected LNA 330 amplifies its input RF signal and provides one or more amplified RF signals to receive circuits 340. Receive circuits 340 downconvert each amplified RF signal from RF to baseband, filter and amplify the downconverted signal, and provide an input baseband signal to data processor 380. Receive circuits 340 may include mixers, filters, amplifiers, matching circuits, oscillators, local oscillator (LO) generators, phase locked loops (PLLs), etc.

For data transmission, data processor 380 processes (e.g., encodes and modulates) data to be transmitted and provides one or more output baseband signals to transmit circuits 350. Transmit circuits 350 amplify, filter, and upconvert each output baseband signal from baseband to RF and provide a modulated signal to a selected PA 360. Transmit circuits 350 may provide one modulated signal to one selected PA for intra-band CA or multiple modulated signals to multiple selected PAs for inter-band CA. Transmit circuits 350 may include amplifiers, filters, mixers, matching circuits, oscillators, LO generators, PLLs, etc. Each selected PA 360 amplifies its modulated signal and provides an output RF signal having the proper transmit power level. The output RF signal is routed through antenna interface circuit 324 and transmitted via antenna 310.

LNAs 332, receive circuits 342, transmit circuits 352, and PAs 362 within transceiver 322 may operate in similar manner as LNAs 330, receive circuits 340, transmit circuits 350, and PAs 360 within transceiver 320. Transceivers 320 and 322 may also include other circuits not shown in FIG. 3. All or a portion of transceivers 320 and 322 may be implemented on one or more analog integrated circuits (ICs), RF ICs (RFICs), mixed-signal ICs, etc. For example, LNAs 330 and receive circuits 340 may be implemented on one module, which may be an RFIC, etc. The circuits in transceivers 320 and 322 may also be implemented in other manners.

Data processor/controller 380 may perform various functions for wireless device 110. For example, data processor 380 may perform processing for data being received via receiver circuits 340 and 342 and data being transmitted via transmit circuits 350 and 352. Controller 380 may control the operation of various circuits within transceivers 320 and 322. A memory 382 may store program codes and data for data processor/controller 380. Data processor/controller 380 may be implemented on one or more application specific integrated circuits (ASICs) and/or other ICs.

FIG. 3 shows an exemplary design of wireless device 110 with two transceivers 320 and 322 coupled to two antennas 310 and 312. In general, a wireless device may include any number of transceivers for any number of antennas. Each transceiver may include any number of LNAs and any number of PAs to support any number of frequency bands, any number of wireless systems, any number of radio technologies, etc.

LNAs 330 and 332 in FIG. 3 may be multi-output LNAs. A multi-output LNA is an amplifier having one or more inputs and multiple outputs. A multi-output LNA may be (i) a SIMO LNA comprising a single input and multiple outputs or (ii) a MIMO LNA comprising multiple inputs and multiple outputs. A multi-output LNA may be used to receive multiple transmitted signals sent concurrently to a wireless device. A multi-output LNA may be implemented in various manners. Some exemplary circuit designs of multi-output LNAs are described below. Multi-output LNAs may also be implemented with transistors of various types. Some exemplary circuit designs of multi-output LNAs implemented with N-channel metal oxide semiconductor (NMOS) transistors are described below.

Figure 4:
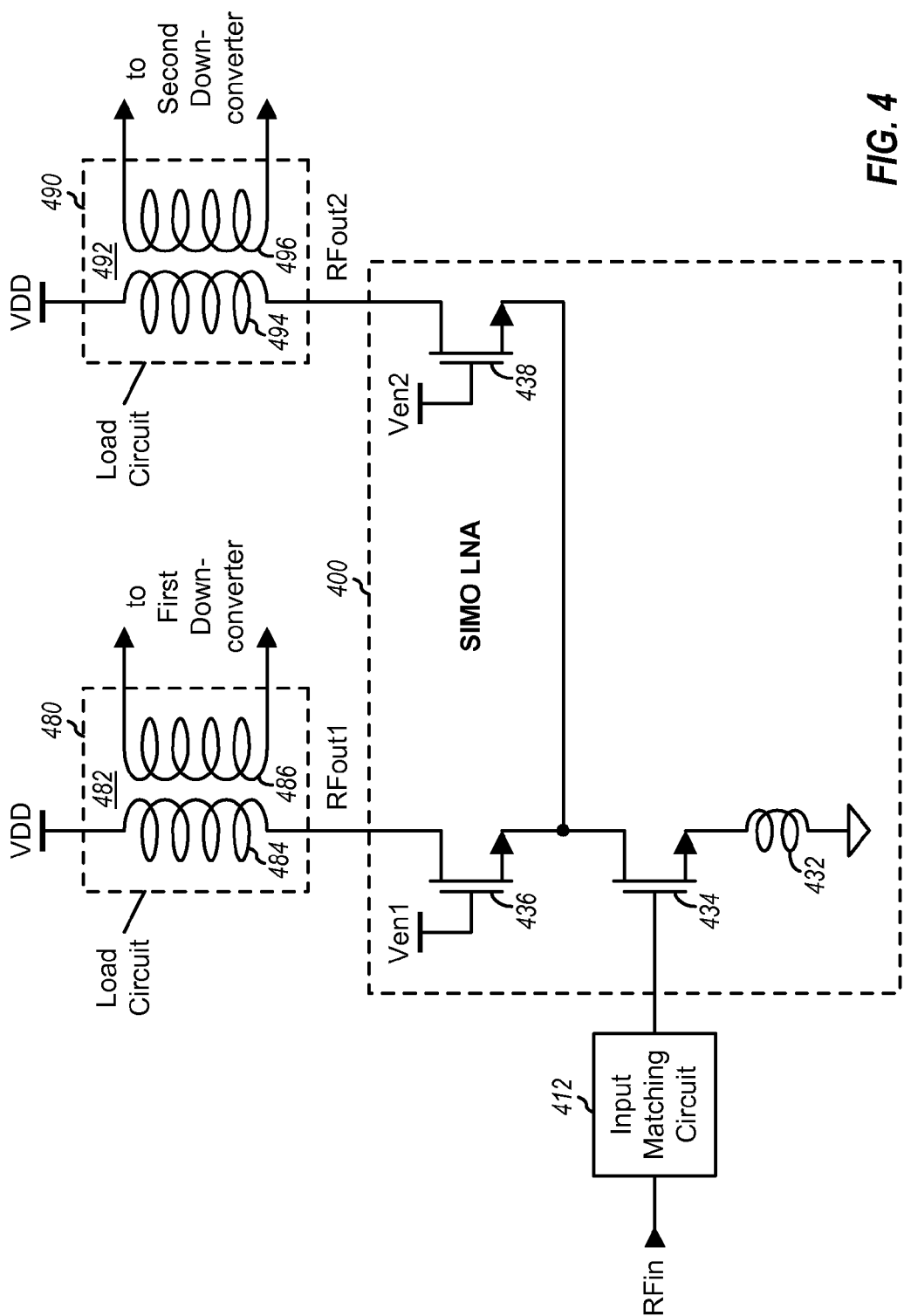
FIG. 4 shows a schematic diagram of a single-input multiple-output (SIMO) low noise amplifier (LNA) with fixed source degeneration inductance.

FIG. 4 shows a schematic diagram of an exemplary design of a SIMO LNA 400. In the exemplary design shown in FIG. 4, LNA 400 includes a source degeneration inductor 432, a gain transistor 434, and two cascode transistors 436 and 438. An input matching circuit 412 has its input receiving an input RF signal (RFin) and its output coupled to the gate of gain transistor 434. Gain transistor 434 has its source coupled to one end of inductor 432 and its drain coupled to the sources of cascode transistors 436 and 438. The other end of inductor 432 is coupled to circuit ground. Cascode transistor 436 has its gate receiving a first control signal (Ven1) and its drain coupled to a load circuit 480. Cascode transistor 438 has its gate receiving a second control signal (Ven2) and its drain coupled to a load circuit 490. Gain transistor 434 and cascode transistors 436 and 438 may be implemented with NMOS transistors, as shown in FIG. 4, or with transistors of other types.

In the exemplary design shown in FIG. 4, load circuit 480 includes a transformer 482 comprising a primary coil 484 and a secondary coil 486. Primary coil 484 is coupled between the drain of cascode transistor 436 and a power supply (VDD). Secondary coil 486 provides a first differential output RF signal to a first downconverter (not shown in FIG. 4). Load circuit 490 includes a transformer 492 having (i) a primary coil 494 coupled between the drain of cascode transistor 438 and the VDD supply and (ii) a secondary coil 496 providing a second differential output RF signal to a second downconverter (not shown in FIG. 4).

Within LNA 400, gain transistor 434 amplifies the RFin signal and provides an amplified signal. When enabled, cascode transistor 436 buffers the amplified signal and drives load circuit 480, which provides a first differential output RF signal to a first downconverter (not shown in FIG. 4). When enabled, cascode transistor 438 buffers the amplified signal and drives load circuit 490, which provides a second differential output RF signal to a second downconverter (also not shown in FIG. 4). Source degeneration inductor 432 performs several functions. First, inductor 432 enables LNA 400 to obtain good dynamic range (e.g., good noise figure) and achieve high sensitivity for a receiver with low power consumption. Second, inductor 432 helps with input matching for LNA 400.

SIMO LNA 400 may operate in a single-output mode or a multi-output mode at any given moment. In the single-output mode, SIMO LNA 400 receives an input RF signal comprising at least one transmitted signal (e.g., on one set of carriers) and provides one output RF signal (e.g., RFout1 or RFout2) for one downconverter. One cascode transistor 436 or 438 is enabled to provide one output RF signal, and the other cascode transistor is disabled. The downconverter may downconvert the output RF signal with an LO signal at a proper frequency. In the multi-output mode, SIMO LNA 400 receives an input RF signal comprising at least two transmitted signals (e.g., on two sets of carriers) and provides two output RF signals for two downconverters (e.g., one output RF signal for each set of carriers). Both cascode transistor 436 or 438 are enabled to provide two output RF signals. Each downconverter may downconvert its output RF signal with an LO signal at a proper frequency.

Gain transistor 434 may be biased with a bias current of Ib in the single-output mode when LNA 400 provides only one output RF signal. Ib may be selected to obtain a desired gain and dynamic range for LNA 400 in the single-output mode. Gain transistor 434 may be biased with a bias current of 2*Ib in the multi-output mode in order to obtain similar dynamic range when LNA 400 provides two output RF signals. However, doubling the bias current to 2*Ib reduces the gain of LNA 400 in the multi-output mode relative to the gain of LNA 400 in the single-output mode with a bias current of Ib. Similar gains in the single-output mode and the multi-output mode may be desirable in order to (i) have one set of design trade-offs (e.g., for noise, linearity, power consumption, etc.) for circuits in a receiver and (ii) simplify receiver programming. Furthermore, doubling the bias current would degrade input matching of LNA 400 in the multi-output mode, e.g., when the same input matching circuit is used for both the single-output mode and the multi-output mode. A more complicated input matching circuit 412 (e.g., comprising multiple circuit components) may be needed to obtain good input matching of LNA 400 in the multi-output mode.

In an aspect of the present disclosure, a multi-output LNA may comprise a configurable degeneration inductor that can maintain the gain, dynamic range, and input matching of the LNA in the multi-output mode. The LNA may be applied a higher bias current in the multi-output mode in order to maintain similar dynamic range as in the single-output mode. The gain of the LNA may be reduced in the multi-output mode due to the higher bias current. The degeneration inductor may be reduced in the multi-output mode in order to boost the gain of the LNA. Reducing the degeneration inductor may also improve input matching of the LNA in the multi-output mode.

In general, a configurable degeneration inductor is a circuit comprising at least one inductor used to degenerate a gain transistor and having a variable inductance. A degeneration inductor may also be referred to as a source degeneration inductor, an emitter degeneration inductor, etc. A configurable degeneration inductor may also be referred to as a programmable degeneration inductor, a variable degeneration inductor, an adjustable degeneration inductor, etc.

Figure 5A:
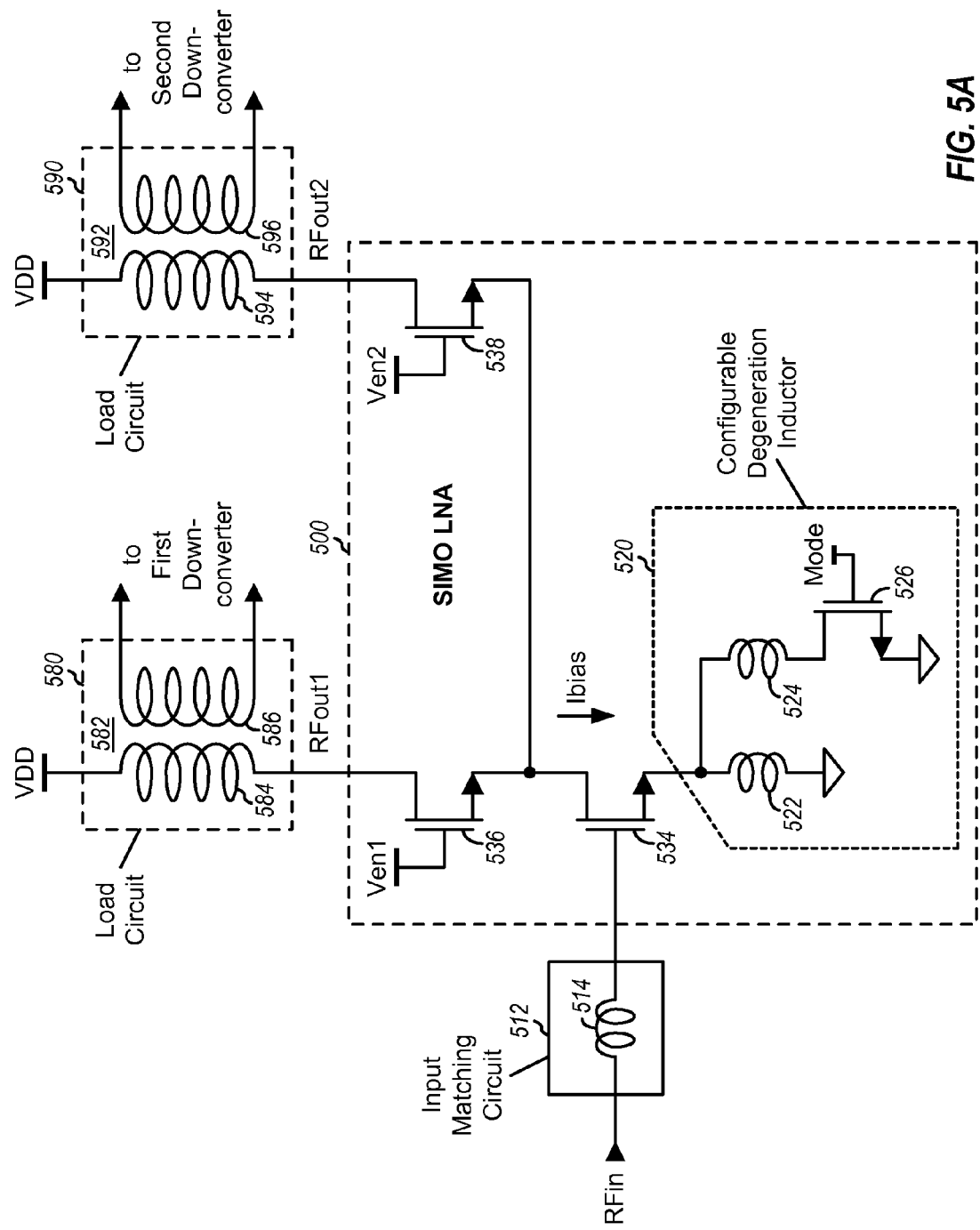
FIGS. 5A to 5D show schematic diagrams of four exemplary designs of a SIMO LNA with configurable source degeneration inductance.

FIG. 5A shows a schematic diagram of an exemplary design of a SIMO LNA 500 with configurable source degeneration inductance. LNA 500 may be used for any of LNAs 330 and 332 in FIG. 3. In the exemplary design shown in FIG. 5A, LNA 500 includes a configurable degeneration inductor 520, a gain transistor 534, and two cascode transistors 536 and 538. An input matching circuit 512 has its input receiving an input RF signal (RFin) and its output coupled to the gate of gain transistor 534. Gain transistor 534 has its source coupled to one end of configurable degeneration inductor 520 and its drain coupled to the sources of cascode transistors 536 and 538. Configurable degeneration inductor 520 is further coupled to circuit ground. Cascode transistor 536 has its gate receiving a first control signal (Ven1) and its drain coupled to a load circuit 580. Cascode transistor 538 has its gate receiving a second control signal (Ven2) and its drain coupled to a load circuit 590. Gain transistor 534 and cascode transistors 536 and 538 may be implemented with NMOS transistors, as shown in FIG. 5A, or with transistors of other types.

In the exemplary design shown in FIG. 5A, source degeneration inductor 520 includes two inductors 522 and 524 coupled in parallel. Inductor 522 has one end coupled to the source of gain transistor 534 and the other end coupled to circuit ground. Inductor 524 has one end coupled to the source of gain transistor 534 and the other end coupled to the drain of a transistor 526. Transistor 526 has its source coupled to circuit ground and its gate receiving a mode control signal (Mode). Inductor 524 and transistor 526 are coupled in series, and the series combination is coupled in parallel with inductor 522. Transistor 526 operates as a switch that may be (i) closed to couple inductor 524 in parallel with inductor 522 or (ii) opened to disconnect inductor 524 from the parallel combination with inductor 522.

LNA 500 may also be implemented in other manners. In another exemplary design, an LNA may include two gain transistors coupled in parallel and having their gates receiving the input RF signal. A first gain transistor may have its source coupled to a configurable degeneration inductor, as shown in FIG. 5A. A second gain transistor may have its source coupled directly to circuit ground. Either the first or second gain transistor may be selected. In another exemplary design, an LNA may include a feedback circuit coupled between an output and an input of the LNA. The feedback circuit may comprise a resistor, a capacitor, a transistor, some other circuit component, or a combination thereof. The feedback circuit may help with input matching and may also improve linearity of the LNA.

In another exemplary design, an LNA may include a cascode circuit in place of each cascode transistor. The cascode circuit may include (i) a first cascode transistor coupled between the drain of a gain transistor and an intermediate node, (ii) a second cascode transistor coupled between the intermediate node and an output of the LNA, and (iii) a shunt transistor coupled between the intermediate node and circuit ground. When the cascode circuit is enabled, the first and second cascode transistors may be turned ON to provide an output RF signal via the LNA output, and the shunt transistor may be turned OFF. When the cascode circuit is disabled, the first and second cascode transistors may be turned OFF to provide no output RF signal at the LNA output, and the shunt transistor may be turned ON to pull the intermediate node to circuit ground and provide better isolation between the LNA output and the gain transistor. Better isolation may be especially desirable when the same load circuit is reused by multiple gain transistors in one or more LNAs.

In the exemplary design shown in FIG. 5A, load circuit 580 includes a transformer 582 comprising a primary coil 584 and a secondary coil 586. Primary coil 584 is coupled between cascode transistor 536 and the VDD supply. Secondary coil 586 provides a first differential output RF signal to a first downconverter (not shown in FIG. 5A). Load circuit 590 includes a transformer 592 having (i) a primary coil 594 coupled between cascode transistor 538 and the VDD supply and (ii) a secondary coil 596 providing a second differential output RF signal to a second downconverter (not shown in FIG. 5A).

Load circuits 580 and 590 may also be implemented in other manners. In another exemplary design, a load circuit may include an inductor and possibly a capacitor coupled between the VDD supply and the drain of a cascode transistor. Cascode transistors 536 and 538 may provide output RF signals at their drains. In yet another exemplary design, a load circuit may include a P-channel metal oxide semiconductor (PMOS) transistor having its source coupled to the VDD supply and its drain coupled to the drain of a cascode transistor (e.g., cascode transistor 536 or 538). The PMOS transistor may provide an active load for the cascode transistor.

For simplicity, FIG. 5A shows SIMO LNA 500 including two cascode transistors 536 and 538 to provide up to two output RF signals to up to two load circuits 580 and 590, e.g., for up to two sets of carriers being received concurrently for carrier aggregation. In general, a SIMO LNA may include N cascode transistors coupled to N load circuits to provide up to N output RF signals, where N may be any integer value greater than one.

SIMO LNA 500 may operate in a single-output mode or a multi-output mode at any given moment. In the single-output mode, LNA 500 receives an input RF signal comprising at least one transmitted signal (e.g., on one set of carriers) and provides one output RF signal via one cascode transistor 536 or 538 to one downconverter circuit. In the multi-output mode, LNA 500 receives an input RF signal comprising at least two transmitted signals (e.g., on two sets of carriers) and provides two output RF signals via two cascode transistors 536 and 538 to two downconverter circuits (e.g., one output RF signal for each set of carriers).

In an exemplary design, gain transistor 534 may be applied (i) a nominal bias current of Ib1 in the single-output mode or (ii) a higher bias current of Ib2 in the multi-output mode, where Ib2>Ib1. The nominal bias current may be selected to obtain a desired dynamic range for LNA 500 in the single-output mode. The higher bias current may be selected to obtain a desired dynamic range for LNA 500 in the multi-output mode. For example, the higher bias current may be selected to obtain similar dynamic range for LNA 500 in the multi-output mode as in the single-output mode. The higher bias current may be twice the nominal bias current (e.g., Ib2=2*Ib1) or some other integer or non-integer multiple of the nominal bias current (e.g., Ib2=m*Ib1, where m>1).

In an exemplary design, LNA 500 may operate with (i) a nominal source degeneration inductance of L1 in the single-output mode or (ii) a smaller source degeneration inductance of L2 in the multi-output mode, where L2<L1. In the single-output mode, transistor 526 may be turned OFF via a low voltage on the Mode signal, only inductor 522 may be coupled between the source of gain transistor 534 and circuit ground, inductor 524 may be disconnected from circuit ground, and the nominal source degeneration inductance may be provided by inductor 522. In the multi-output mode, transistor 526 may be turned ON via a high voltage on the Mode signal, both inductors 522 and 524 may be coupled between the source of gain transistor 534 and circuit ground, and the smaller source degeneration inductance may be provided by the parallel combination of inductors 522 and 524. Inductor 522 may be designed to provide the desired source degeneration inductance of L1 in the single-output mode. The parallel combination of inductors 522 and 524 may be designed to provide the desired source degeneration inductance of L2 in the multi-output mode. Inductance L2 may be approximately one half of inductance L1 or some other fraction of L1.

In an exemplary design, LNA 500 may support multiple gain settings in the single-output mode and/or the multi-output mode. For example, a high gain setting and a low gain setting may be supported in the multi-output mode. The high gain setting may be used to obtain higher gain with a smaller source degeneration inductance by turning ON transistor 526. The low gain setting may be used to obtain a lower gain with a larger source degeneration inductance by turning OFF transistor 526. Different gains may also be supported in each gain setting of each mode by varying the bias current of gain transistor 534.

In general, input matching for an LNA may be achieved with an active circuit (e.g., comprising one or more transistors) or a passive circuit (e.g., comprising one or more resistors, inductors, capacitors, etc.). It may be desirable to use only one circuit component (e.g., one inductor) for input matching in order to reduce cost, power consumption, and circuit area. It may also be desirable to use the same circuit component (e.g., the same inductor) for input matching in both the single-output mode and the multi-output mode.

In the exemplary design shown in FIG. 5A, input matching circuit 512 comprises an inductor 514 coupled between the input and output of input matching circuit 512. A single circuit component (e.g., only inductor 514) may be sufficient to obtain good input matching for LNA 500 in both the single-output mode and the multi-output mode. Inductor 514 may be designed to provide good input matching in the single-output mode with the minimal bias current of Ib1 for gain transistor 534 and the nominal source degeneration inductance of L1 provided by inductor 522. Input matching of LNA 500 with inductor 514 may be degraded in the multi-output mode due to the higher bias current of Ib2 for gain transistor 534. However, using a smaller source degeneration inductance of L2 in the multi-output mode may improve input matching of LNA 500 with inductor 514. In general, inductor 514 may be designed to obtain good input matching in both the single-output mode and the multi-output mode based on the bias current and the source degeneration inductance used for each mode.

Input matching circuit 512 may also be implemented in other manners. For example, input matching circuit 512 may comprise a shunt capacitor coupled between the input and circuit ground, or a shunt capacitor coupled between the output and circuit ground, or a capacitor coupled between the gate and source of gain transistor 534, or some other circuit component coupled in other manners, or a combination thereof. Each capacitor may be a fixed capacitor or a configurable capacitor. A configurable capacitor may be implemented with a variable capacitor (varactor) having a capacitance that can be varied with an analog voltage. A configurable capacitor may also be implemented with a bank of switchable capacitors, with each switchable capacitor comprising a capacitor coupled in series with at least one switch. Each switchable capacitor may be selected by closing the series switch(es) or unselected by opening the series switch(es).

Figure 5B:
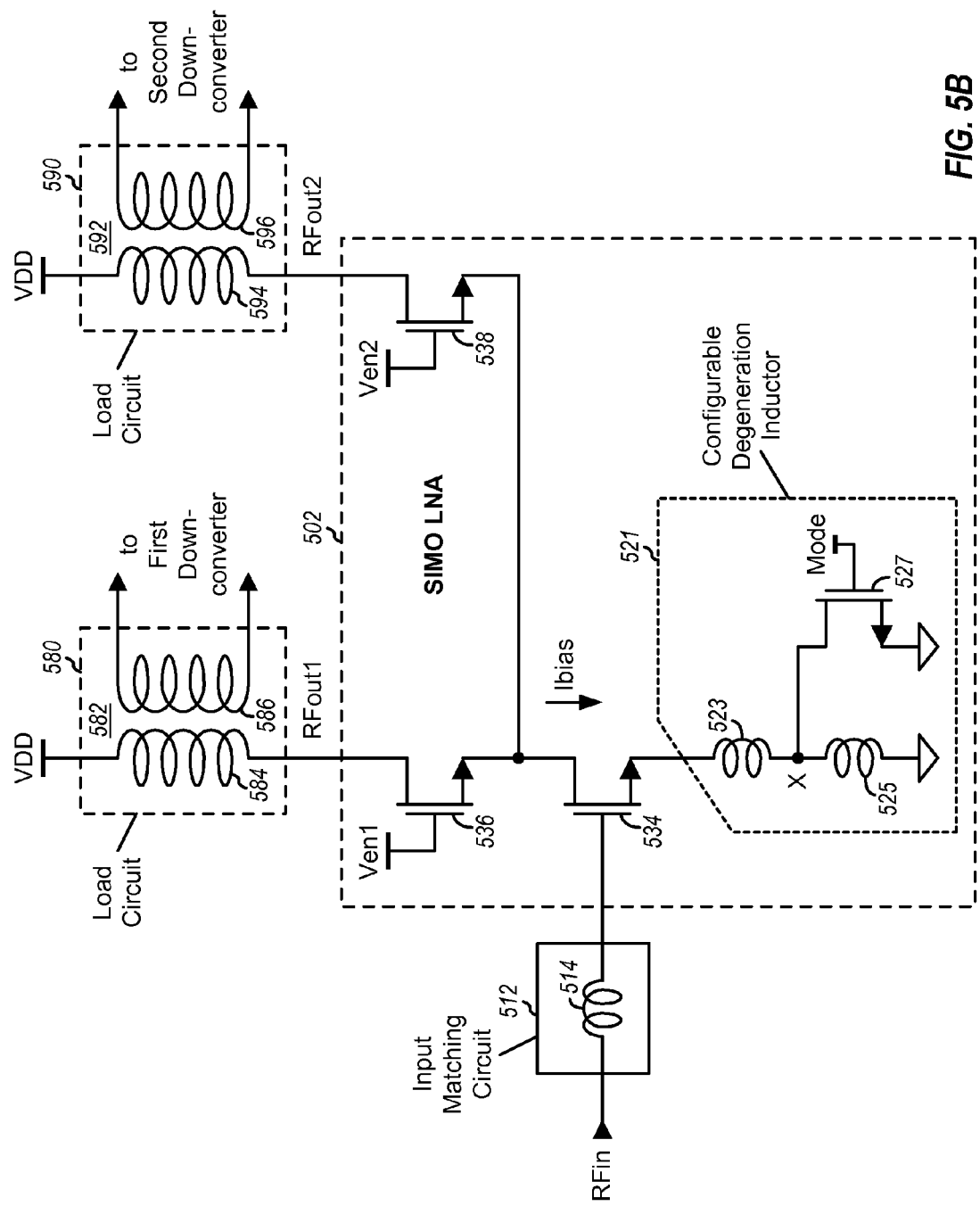

FIG. 5B shows a schematic diagram of an exemplary design of a SIMO LNA 502 with configurable source degeneration inductance. LNA 502 may also be used for any of LNAs 330 and 332 in FIG. 3. In the exemplary design shown in FIG. 5B, LNA 502 includes all of the circuit components in LNA 500 in FIG. 5A, except that configurable degeneration inductor 520 in LNA 500 in FIG. 5A is replaced with a configurable degeneration inductor 521 in LNA 502 in FIG. 5B.

In the exemplary design shown in FIG. 5B, source degeneration inductor 521 includes two inductors 523 and 525 coupled in series. Inductor 523 has one end coupled to the source of gain transistor 534 and the other end coupled to node X. Inductor 525 has one end coupled to node X and the other end coupled to circuit ground. A transistor 527 has its source coupled to circuit ground, and its gate receiving a mode control signal (Mode), and its drain coupled to node X. Inductor 525 and transistor 527 are coupled in parallel, and the parallel combination is coupled in series with inductor 523. Transistor 527 operates as a switch that may be (i) opened to couple inductor 525 in series with inductor 523 or (ii) closed to short inductor 525 and couple inductor 523 to circuit ground. In general, a source degeneration inductor may include any number of inductors coupled in series and any number switches coupled to the inductors. More than two inductors and more than one switch may be used to obtain more than two different source degeneration inductance values, which may be desirable for more than two load circuits. Different numbers of RFout signals or different combinations of RFout signals may be associated with different source degeneration inductance values.

SIMO LNA 502 may operate in a single-output mode or a multi-output mode at any given moment. LNA 502 may operate with (i) a nominal source degeneration inductance in the single-output mode and (ii) a smaller source degeneration inductance in the multi-output mode. In the single-output mode, transistor 527 may be turned OFF via a low voltage on the Mode signal, both inductors 523 and 525 may be coupled in series and between the source of gain transistor 534 and circuit ground, and the nominal source inductance may be provided by the series combination of inductors 523 and 525. In the multi-output mode, transistor 527 may be turned ON via a high voltage on the Mode signal, inductor 525 may be shorted by transistor 527, only inductor 523 may be coupled between the source of gain transistor 534 and circuit ground, and the smaller source inductance may be provided by inductor 523. Inductor 523 may be designed to provide the desired source degeneration inductance of L2 in the multi-output mode. The series combination of inductors 523 and 525 may be designed to provide a desired source degeneration inductance of L1 in the single-output mode, where L1>L2. Inductance L1 may be approximately twice inductance L2 or some other integer or non-integer multiple of L1.

Figure 5C:
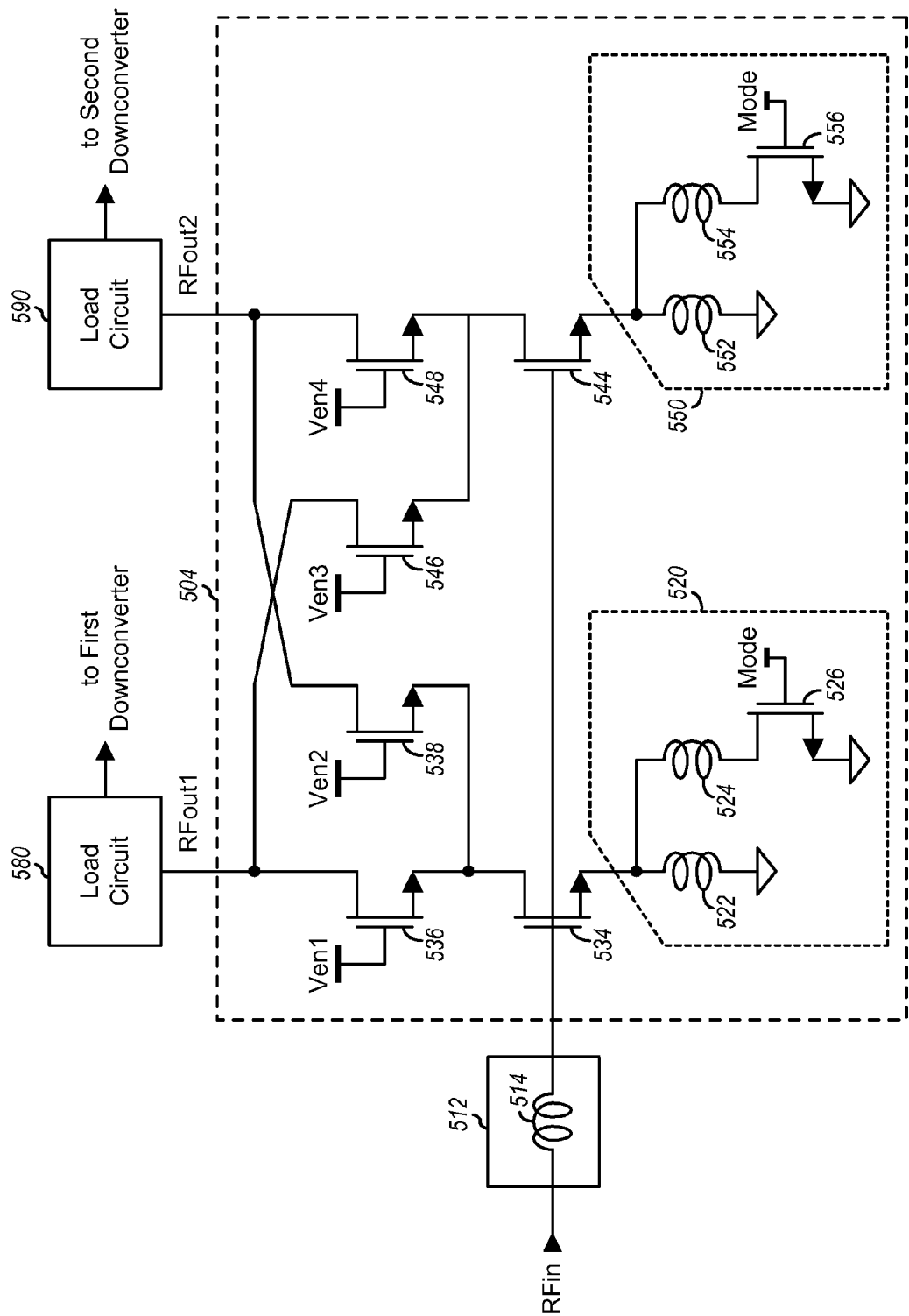

FIG. 5C shows a schematic diagram of an exemplary design of a SIMO LNA 504 with configurable source degeneration inductance. LNA 504 may also be used for any of LNAs 330 and 332 in FIG. 3. In the exemplary design shown in FIG. 5C, LNA 504 includes all of the circuit components in LNA 500 in FIG. 5A. LNA 504 further includes a second gain transistor 544, a second configurable degeneration inductor 550, and cascode transistors 546 and 548. Gain transistor 544 has its gate coupled to the output of input matching circuit 512, its source coupled to configurable degeneration inductor 550, and its drain coupled to the sources of cascode transistors 546 and 548. Configurable degeneration inductor 550 is further coupled to circuit ground. Cascode transistor 546 has its gate receiving a third control signal (Ven3) and its drain coupled to load circuit 580. Cascode transistor 548 has its gate receiving a fourth control signal (Ven4) and its drain coupled to load circuit 590.

In the exemplary design shown in FIG. 5C, source degeneration inductor 550 includes two inductors 552 and 554 coupled in parallel. Inductor 552 has one end coupled to the source of gain transistor 544 and the other end coupled to circuit ground. Inductor 554 has one end coupled to the source of gain transistor 544 and the other end coupled to the drain of a transistor 556. Transistor 556 has its source coupled to circuit ground and its gate receiving the Mode signal. Inductor 554 and transistor 556 are coupled in series, and the series combination is coupled in parallel with inductor 552. Transistor 556 operates as a switch that may be (i) closed to couple inductor 554 in parallel with inductor 552 or (ii) opened to disconnect inductor 554 from the parallel combination with inductor 552.

In the exemplary design shown in FIG. 5C, each gain transistor is coupled to a separate configurable degeneration inductor. In another exemplary design, one gain transistor (e.g., gain transistor 534) may be coupled to a configurable degeneration inductor, and the other gain transistor may be coupled to a fixed inductor. In yet another exemplary design, one gain transistor (e.g., gain transistor 534) may be coupled to a configurable degeneration inductor, and the other cascode transistor may be coupled directly to circuit ground.

SIMO LNA 504 may operate in a single-output mode or a multi-output mode at any given moment. In one exemplary design of the single-output mode, both gain transistors 534 and 544 may be enabled, and two cascode transistors may be enabled. Cascode transistors 536 and 546 may be enabled to generate a first output RF signal (RFout1) for load circuit 580, and cascode transistors 538 and 548 may be disabled. Alternatively, cascode transistors 538 and 548 may be enabled to generate a second output RF signal (RFout2) for load circuit 590, and cascode transistors 536 and 546 may be disabled. In another exemplary design, one gain transistor 534 or 544 may be enabled, and one cascode transistor may be enabled. For both exemplary designs, a suitable source degeneration inductor may be selected for each gain transistor that is enabled in order to obtain the desired dynamic range, gain, and input matching for LNA 504 in the single-output mode.

In the multi-output mode, both gain transistors 534 and 544 may be enabled. Cascode transistors 536 and 548 may be enabled to generate the RFout1 and RFout2 signals for load circuits 580 and 590, respectively, and cascode transistors 538 and 546 may be disabled. Alternatively, all four cascode transistors 536, 538, 546 and 548 may be enabled. A suitable source degeneration inductor may be selected for each gain transistor in order to obtain the desired dynamic range, gain, and input matching for LNA 504 in the multi-output mode.

In the exemplary design shown in FIG. 5C, the input RF signal is split at the "gate" level by having the input RF signal applied to two gain transistors 534 and 544 driving cascode transistors 536, 538, 546 and 548. In contrast, in the exemplary design shown in FIGS. 5A and 5B, the input RF signal is split at the "cascode" level by having the input RF signal applied to a single gain transistor driving two cascode transistors 536 and 538. Splitting the input RF signal at the gate level (as shown in FIG. 5C) may provide better performance than splitting the input RF signal at the cascode level (as shown in FIGS. 5A and 5B). The better performance with gate-level splitting may include better gain, lower noise figure, improved linearity, better isolation to reduce coupling of leaked LO signals for downconverters, etc.

Figure 5D:
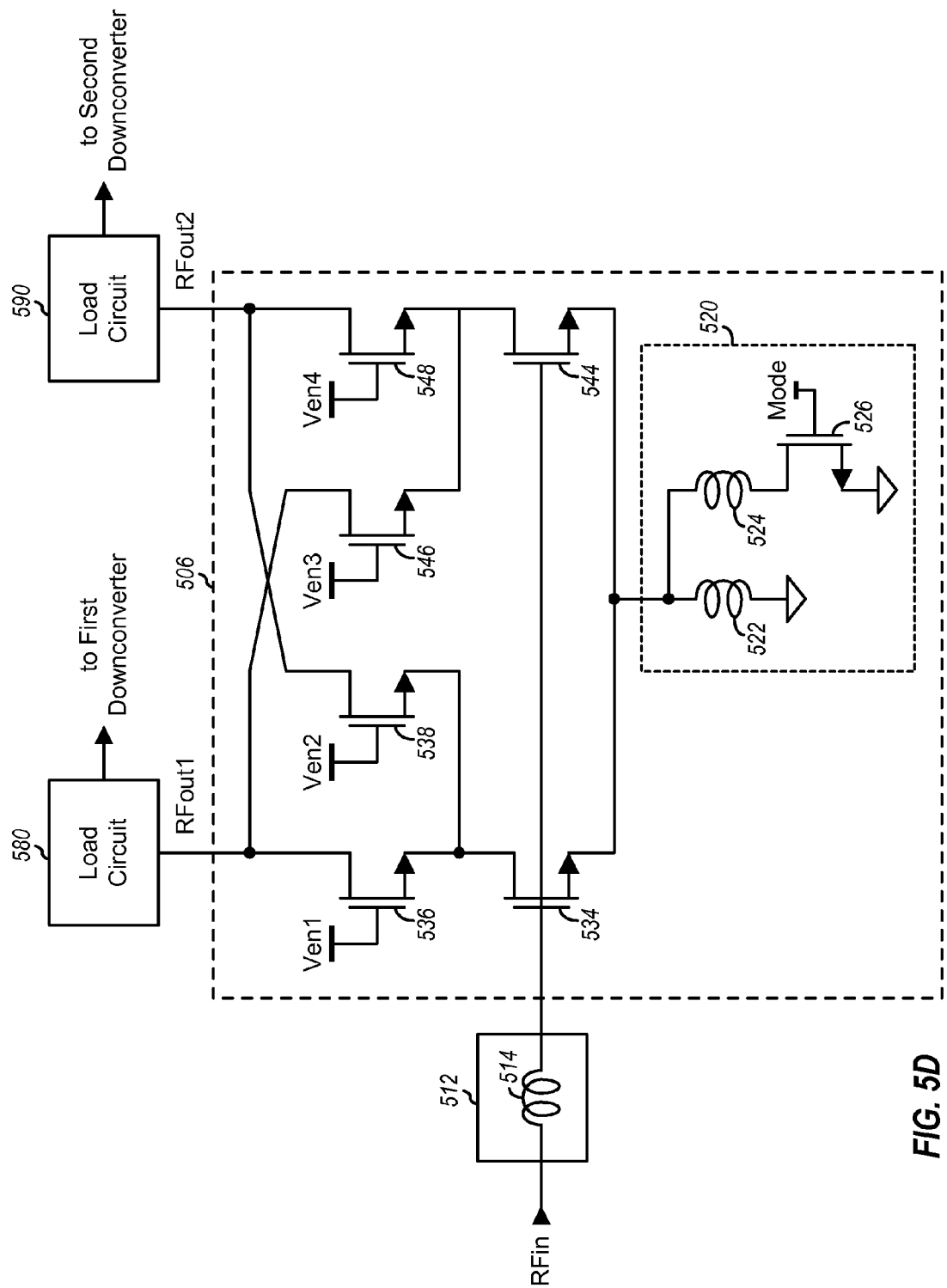

FIG. 5D shows a schematic diagram of an exemplary design of a SIMO LNA 506 with configurable source degeneration inductance. LNA 506 may also be used for any of LNAs 330 and 332 in FIG. 3. In the exemplary design shown in FIG. 5D, LNA 506 includes all of the circuit components in LNA 504 in FIG. 5C, except for configurable degeneration inductor 550, which is omitted from LNA 506. Gain transistors 534 and 544 have their sources coupled together and to configurable degeneration inductor 520, which is further coupled to circuit ground.

SIMO LNA 506 may operate in a single-output mode or a multi-output mode at any given moment. One or more gain transistors and one or more cascode transistors may be enabled for each mode, as described above for FIG. 5C. In the single-output mode, only inductor 522 may be selected, and inductor 524 may be disconnected by turning OFF transistor 526. In the multi-output mode, both inductors 522 and 524 may be selected by turning ON transistor 526. Inductor 522 may be designed to provide the desired gain, dynamic range, and input matching for LNA 506 in the single-output mode. Inductors 522 and 524 may be designed to provide the desired gain, dynamic range, and input matching for LNA 506 in the multi-output mode.

FIGS. 5A to 5D show four exemplary designs of SIMO LNAs with configurable source degeneration inductance. A SIMO LNA with configurable source degeneration inductance may also be implemented in other manners. In another exemplary design, a SIMO LNA may include divert cascode transistor 538 or 548 (instead of both divert cascode transistors 538 and 548 as shown in FIG. 5C). In yet another exemplary design, a SIMO LNA may include one or more gain transistors each having its source coupled to circuit ground (instead of to a source degeneration inductor). In yet another exemplary design, a SIMO LNA may include a feedback circuit coupled between an input and an output of the LNA. The feedback circuit may comprise a resistor, a capacitor, a transistor, some other circuit component, or a combination thereof. The feedback circuit may help with input matching and may also improve linearity of the LNA.

Figure 6:
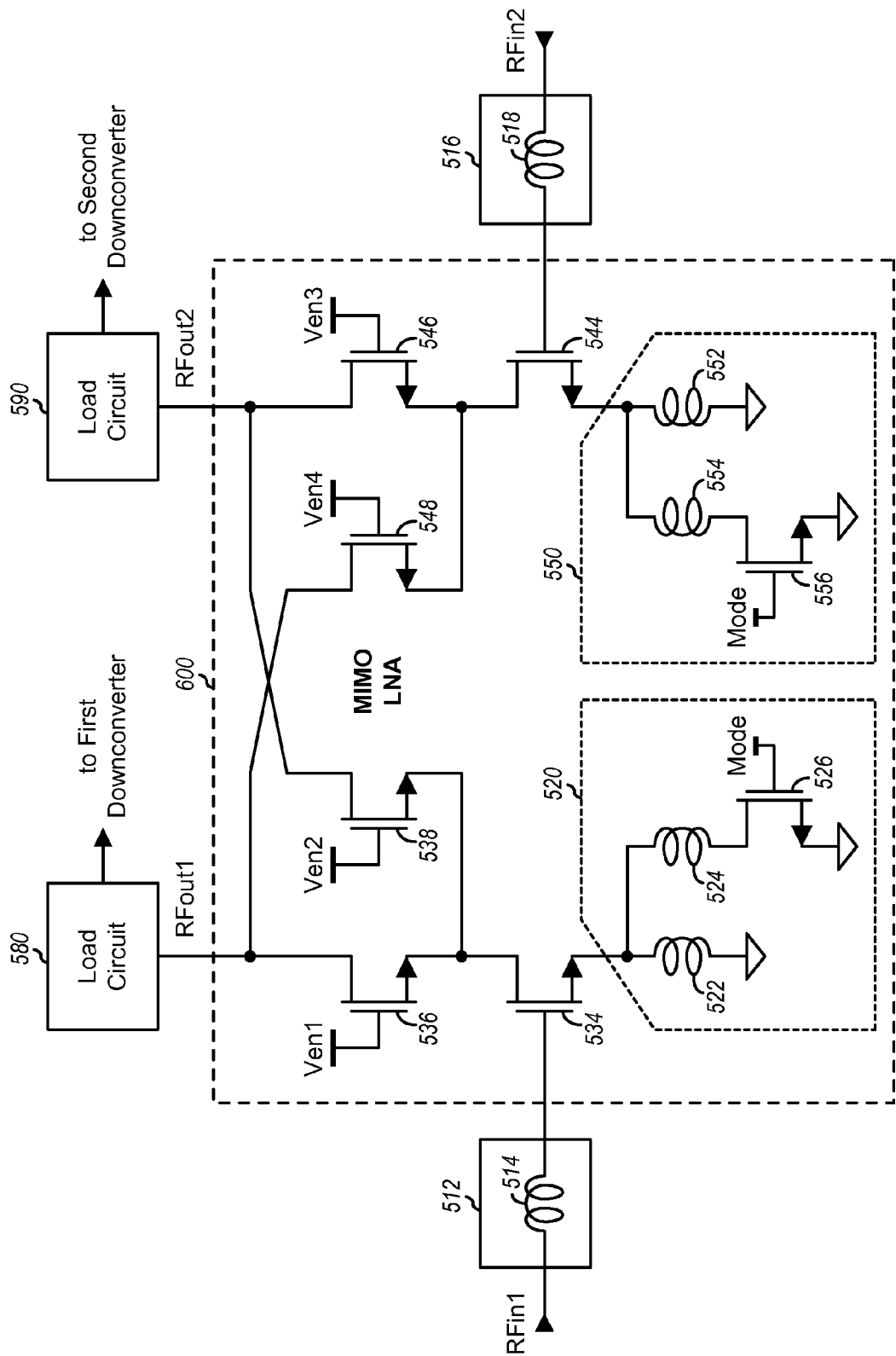
FIG. 6 shows a schematic diagram of an exemplary design of a multiple-input multiple-output (MIMO) LNA with configurable source degeneration inductance.

FIG. 6 shows a schematic diagram of an exemplary design of a MIMO LNA 600 with configurable source degeneration inductance. LNA 600 may be used for any of LNAs 330 and 332 in FIG. 3. In the exemplary design shown in FIG. 6, LNA 600 includes all of the circuit components in LNA 504 in FIG. 5C. However, gain transistors 534 and 544 are not coupled together as in LNA 504. Rather, gain transistor 534 has its gate coupled to input matching circuit 512, which receives a first input RF signal (RFin1). Input matching circuit 512 may perform input matching for LNA 600 for a first band. Gain transistor 544 has its gate coupled to an input matching circuit 516, which receives a second input RF signal (RFin2). Input matching circuit 516 may include an inductor 518 coupled between the input and output of circuit 516 and may perform input matching for LNA 600 for a second band. LNA 600 may thus support intra-band CA as well as inter-band CA.

MIMO LNA 600 may operate in a single-output mode, a SIMO mode, or a MIMO mode at any given moment. In the single-output mode, one input RF signal (e.g., RFin1 or RFin2) may be amplified by one gain transistor (e.g., gain transistor 534 or 544) and buffered by one cascode transistor (e.g., cascode transistor 536, 538, 546 or 548) to obtain one output RF signal (e.g., RFout1 or RFout2) for one load circuit (e.g., load circuit 580 or 590). In the SIMO mode, one input RF signal (e.g., RFin1 or RFin2) may be amplified by one gain transistor (e.g., gain transistor 534 or 544) and buffered by two cascode transistor (e.g., cascode transistors 536 and 538 or cascode transistors 546 and 548) to obtain two output RF signals (e.g., RFout1 and RFout2) for two load circuits (e.g., load circuits 580 and 590). In the MIMO mode, two input RF signals (e.g., RFin1 and RFin2) may be amplified by two gain transistors (e.g., gain transistors 534 and 544) and buffered by two cascode transistors (e.g., cascode transistors 536 and 546 or cascode transistors 538 and 548) to obtain two output RF signals (e.g., RFout1 and RFout2) for two load circuits (e.g., load circuits 580 and 590).

Configurable degeneration inductors 520 and 550 may be operated to provide good performance in the single-output mode, the SIMO mode, and the MIMO mode. When gain transistor 534 is enabled in the single-output mode or the MIMO mode, configurable degeneration inductor 520 may be set (e.g., by turning OFF transistor 526) such that inductor 522 provides a nominal source degeneration inductance. When gain transistor 534 is enabled in the SIMO mode, configurable degeneration inductor 520 may be set (e.g., by turning ON transistor 526) such that inductors 522 and 524 provide a smaller source degeneration inductance. Similarly, when gain transistor 544 is enabled in the single-output mode or the MIMO mode, configurable degeneration inductor 550 may be set (e.g., by turning OFF transistor 556) such that inductor 552 provides a nominal source degeneration inductance. When gain transistor 544 is enabled in the SIMO mode, configurable degeneration inductor 550 may be set (e.g., by turning ON transistor 556) such that inductors 552 and 554 provide a smaller source degeneration inductance.

FIG. 6 shows an exemplary design of a MIMO LNA with configurable source degeneration inductance. A MIMO LNA with configurable source degeneration inductance may also be implemented in other manners. In another exemplary design, a MIMO LNA may include multiple gain transistors having their gates coupled together for each input RF signal (e.g., as shown in FIG. 5C or 5D). Each gain transistor may be coupled to a separate configurable degeneration inductor (e.g., as shown in FIG. 5C). Alternatively, multiple gain transistors may have their sources coupled together and to a common configurable degeneration inductor (e.g., as shown in FIG. 5D). Each gain transistor may be coupled to one or more load circuits via one or more cascode transistors. In yet another exemplary design, a MIMO LNA may include a feedback circuit coupled between an input and an output of the LNA. The feedback circuit may comprise a resistor, a capacitor, a transistor, some other circuit component, or a combination thereof.

FIG. 6 shows an exemplary design of a MIMO LNA with two inputs receiving two input RF signals and two outputs coupled to two load circuits. In general, a MIMO LNA may include any number of inputs and any number of outputs. An input matching circuit may be coupled to each LNA input and may perform input matching for a particular band of interest. Each LNA input may also be coupled to one or more gain transistors, which may have their gates coupled together. Each gain transistor may be coupled to one or more LNA outputs via one or more cascode transistors. A gain transistor may be coupled to a separate configurable degeneration inductor. Alternatively, multiple gain transistors (e.g., for the same LNA input) may have their sources coupled together and to a common configurable degeneration inductor.

FIGS. 5A to 6 show exemplary designs in which two independent source degeneration inductors are coupled to the source of a gain transistor. In another exemplary design, two inductors coupled to the source of a gain transistor (e.g., inductors 522 and 524 in FIG. 5A) may be magnetically coupled and may have a coupling coefficient k, which may be within a range of 0 to 1, or $0 \leq k \leq 1$. The coupling coefficient k may be dependent on the implementation (e.g., layout, placement, and spacing) of the two inductors. A mutual inductance M due to magnetic coupling between the two inductors may be expressed as $M = k \cdot \sqrt{L_1 \cdot L_2}$, where $L_1$ and $L_2$ are the inductances of the two inductors. The source degeneration inductance of the gain transistor may be dependent on the mutual inductance.

FIGS. 5A to 6 show exemplary designs of single-ended LNAs that receive single-ended input RF signals and provide single-ended output RF signals. Differential LNAs with configurable source degeneration inductance may also be implemented. For example, the circuit for LNA 500 in FIG. 5A may be replicated. One copy of the circuit may receive a non-inverting input RF signal and provide one or more inverting output RF signals. The other copy of the circuit may receive an inverting input RF signal and provide one or more non-inverting output RF signals. Differential LNAs with configurable source degeneration inductance may also be implemented in other manners.

Multi-output amplifiers (e.g., multi-output LNAs) with configurable source degeneration inductance described herein may provide various advantages. First, the multi-output amplifiers may be used to receive multiple transmitted signals sent concurrently from one or more base stations in one or more wireless systems, e.g., for carrier aggregation, CoMP, concurrent services, etc. Second, the multi-output amplifiers may provide good performance (e.g., good dynamic range, gain, input matching, etc.) in both the single-output mode and the multi-output mode. Third, input matching for the multi-output amplifiers may be simplified, e.g., with a single circuit component such as a series inductor shown in FIGS. 5A and 5B. The simplified input matching may be possible due to the multi-output amplifiers having less variation in input impedance as a result of reducing the source degeneration inductance with higher bias current in the multi-output mode. The simplified input matching may result in lower cost, smaller circuit area, etc. Fourth, the multi-output amplifiers may be designed and configured to have similar gain in the single-output mode and the multi-output mode, e.g., without having to consume more battery power in the multi-output mode. Similar gain for both the single-output mode and the multi-output mode may result in similar sensitivity in both modes as well as reduced complexity by having one setting for baseband circuits for both modes.

A configurable degeneration inductor may enable a multi-output amplifier to obtain good dynamic range, high gain, and good input matching in both the single-output mode and the multi-output mode. The configurable degeneration inductor may also allow a single circuit component (e.g., inductor 514 in FIGS. 5A and 5B) to be used for input matching of the multi-output amplifier. Reducing the number of circuit components for input matching may be highly desirable in order to reduce cost, circuit area, etc.

In an exemplary design, an apparatus (e.g., a wireless device, an IC, a circuit module, etc.) may include a gain transistor and a configurable degeneration inductor for an amplifier. The gain transistor (e.g., gain transistor 534 in FIGS. 5A to 5D) may receive an input signal and provide an amplified signal. The amplifier may provide a single output signal in a first operating mode (e.g., a single-output mode) or a plurality of output signals in a second operating mode (e.g., a multi-output mode). The configurable degeneration inductor (e.g., configurable degeneration inductor 520 in FIG. 5A or configurable degeneration inductor 521 in FIG. 5B) may be coupled to the gain transistor and may provide a first source degeneration inductance in the first operating mode or a second source degeneration inductance in the second operating mode. The second source degeneration inductance may be less than the first source degeneration inductance and may be dependent on the number of output signals generated in the second operating mode. For example, the second source degeneration inductance may be approximately one half of the first source degeneration inductance if two output signals are generated in the second operating mode.

In an exemplary design shown in FIG. 5A, the configurable degeneration inductor may include a first inductor (e.g., inductor 522) coupled between the gain transistor and circuit ground, a second inductor (e.g., inductor 524) coupled between the gain transistor and an intermediate node, and a shunt transistor (e.g., transistor 526) coupled between the intermediate node and circuit ground. In another exemplary design shown in FIG. 5B, the configurable degeneration inductor may include a first inductor (e.g., inductor 523) coupled between the gain transistor and an intermediate node, a second inductor (e.g., inductor 525) coupled between the intermediate node and circuit ground, and a shunt transistor (e.g., transistor 527) coupled between the intermediate node and circuit ground. The configurable degeneration inductor may also be implemented in other manners based on other circuit designs.

In an exemplary design, the apparatus may further include first and second cascode transistors. The first cascode transistor (e.g., cascode transistor 536 in FIGS. 5A and 5B) may be coupled to the gain transistor and may receive the amplified signal and provide a first output signal. The second cascode transistor (e.g., cascode transistor 538 in FIGS. 5A and 5B) may also be coupled to the gain transistor and may receive the amplified signal and provide a second output signal. One of the first and second cascode transistors may be enabled in the first operating mode to provide the single output signal. Both of the first and second cascode transistors may be enabled in the second operating mode to provide two output signals. In general, a plurality of cascode transistors may be coupled to the gain transistor and may receive the amplified signal and provide the single output signal in the first operating mode or the plurality of output signals in the second operating mode. The plurality of cascode transistors may include the first and second cascode transistors and possibly additional cascode transistors.

In another exemplary design, the apparatus may further include a second gain transistor and third and fourth cascode transistors, e.g., for a SIMO LNA shown in FIG. 5C or 5D. The second gain transistor (e.g., gain transistor 544 in FIG. 5C or 5D) may receive the input signal and provide a second amplified signal. The first and second gain transistors may thus receive the same input signal. The third and fourth cascode transistors (e.g., cascode transistors 546 and 548) may be coupled to the second gain transistor. The first to fourth cascode transistors may provide the single output signal in the first operating mode or the plurality of output signals in the second operating mode. In general, a second plurality of cascode transistors may be coupled to the second gain transistor and may receive the second amplified signal. The plurality of cascode transistors coupled to the gain transistor and the second plurality of cascode transistors coupled to the second gain transistor may provide the single output signal in the first operating mode or the plurality of output signals in the second operating mode.

In an exemplary design, the gain transistor and the second gain transistor may have their sources coupled together and to the configurable degeneration inductor, e.g., as shown in FIG. 5C. In another exemplary design, the second gain transistor may be coupled to a second configurable degeneration inductor (e.g., configurable degeneration inductor 550 in FIG. 5C), which may provide a third source degeneration inductance in the first operating mode or a fourth source degeneration inductance in the second operating mode.

In another exemplary design, the apparatus may further include a second gain transistor, third and fourth cascode transistors, and a second configurable degeneration inductor, e.g., for a MIMO LNA shown in FIG. 6. The second gain transistor (e.g., gain transistor 544 in FIG. 6) may receive a second input signal and provide a second amplified signal. The gain transistor and second gain transistor may thus receive different input signals, e.g., as shown in FIG. 6. The third and fourth cascode transistors (e.g., cascode transistors 546 and 548 in FIG. 6) may be coupled to the second gain transistor. The first to fourth cascode transistors may provide the single output signal in the first operating mode or the plurality of output signals in the second operating mode. The second configurable degeneration inductor (e.g., configurable degeneration inductor 550 in FIG. 6) may be coupled to the second gain transistor and may provide a third source degeneration inductance in the first operating mode or a fourth source degeneration inductance in the second operating mode. In general, a second plurality of cascode transistors may be coupled to the second gain transistor and may receive the second amplified signal, The plurality of cascode transistors coupled to the gain transistor receiving the input signal and the second plurality of cascode transistors coupled to the second gain transistor receiving the second input signal may provide the single output signal in the first operating mode or the plurality of output signals in the second operating mode In an exemplary design, the gain transistor may be applied a first bias current in the first operating mode or a second bias current in the second operating mode. The second bias current may be larger than the first bias current and may be dependent on the number of output signals generated in the second operating mode. For example, the second bias current may be approximately twice the first bias current if two output signals are generated in the second operating mode. In an exemplary design, the first and second bias currents may be fixed bias currents. In another exemplary design, the first bias current may be adjustable to obtain a first variable gain in the first operating mode and/or the second bias current may be adjustable to obtain a second variable gain in the second operating mode.

In an exemplary design, the apparatus may further include an input matching circuit (e.g., input matching circuit 512 in FIGS. 5A and 5B) coupled to the gain transistor. The input matching circuit may receive an input RF signal and provide the input signal to the gain transistor. In an exemplary design, the input matching circuit may comprise only an inductor (e.g., inductor 514) coupled between an input and an output of the input matching circuit. In other exemplary designs, the input matching circuit may include one or more additional circuit components (e.g., one or more capacitors, inductors, and/or resistors) for input matching of the amplifier.

Figure 7:
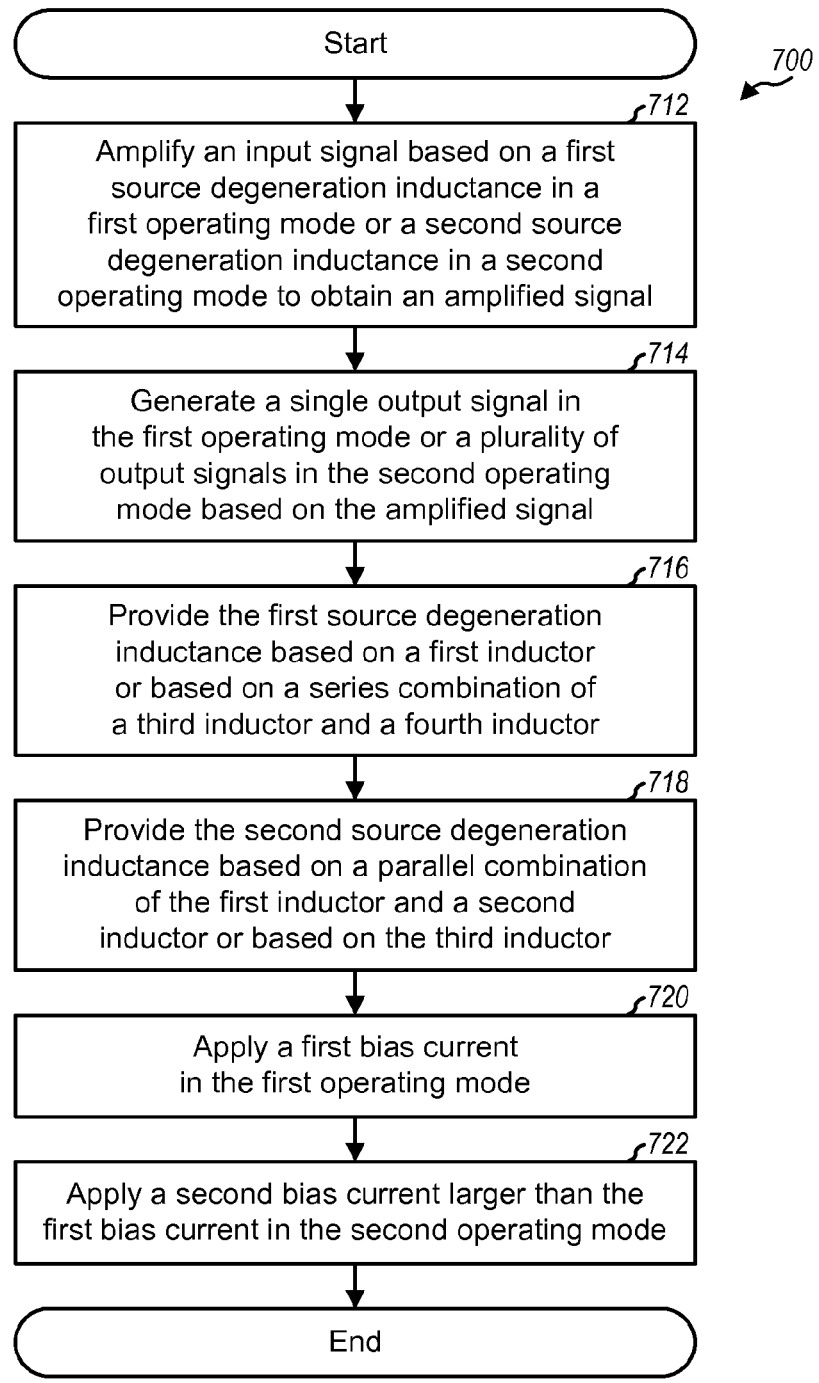
FIG. 7 shows a process for performing amplification.

FIG. 7 shows an exemplary design of a process 700 for performing amplification. An input signal may be amplified based on a first source degeneration inductance in a first operating mode or a second source degeneration inductance in a second operating mode to obtain an amplified signal (block 712). The second source degeneration inductance may be smaller than the first source degeneration inductance. A single output signal may be generated in the first operating mode or a plurality of output signals may be generated in the second operating mode based on the amplified signal (block 714). The first source degeneration inductance may be provided based on a first inductor (e.g., inductor 522 in FIG. 5A) or based on a series combination of a third inductor and a fourth inductor (e.g., inductors 523 and 525 in FIG. 5B) (block 716). The second source degeneration inductance may be provided based on a parallel combination of the first inductor and a second inductor (e.g., inductors 522 and 524 in FIG. 5A) or based on the third inductor (e.g., inductor 523 in FIG. 5B) (block 718). A first bias current may be applied in the first operating mode (block 720). A second bias current larger than the first bias current may be applied in the second operating mode (block 722).

In an exemplary design, for a MIMO amplifier, a second input signal may be amplified based on a third source degeneration inductance in the first operating mode or a fourth source degeneration inductance in the second operating mode to obtain a second amplified signal. The single output signal may be generated in the first operating mode or the plurality of output signals may be generated in the second operating mode based on the amplified signal and/or the second amplified signal.

The multi-output amplifiers with configurable source degeneration inductance described herein may be implemented on an IC, an analog IC, an RFIC, a mixed-signal IC, an ASIC, a printed circuit board (PCB), an electronic device, etc. These amplifiers may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the amplifiers described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   a gain transistor of an amplifier, the gain transistor configured to receive an input signal and to provide an amplified signal, the amplifier configured to provide a single output signal based on a first operating mode and to provide a plurality of output signals based on a second operating mode;
   a configurable degeneration inductor coupled to the gain transistor and configured to provide a first source degeneration inductance based on the first operating mode and to provide a second source degeneration inductance based on the second operating mode;
   a first transistor coupled to the gain transistor; and
   a second transistor coupled to the gain transistor.

2. The apparatus of claim 1, wherein the second source degeneration inductance is less than the first source degeneration inductance.

3. The apparatus of claim 1, wherein the configurable degeneration inductor comprises:
   a first inductor coupled between a first node and ground, the first node coupled to the gain transistor;
   a second inductor coupled between the first node and a second node; and
   a shunt transistor coupled between the second node and ground.

4. The apparatus of claim 1, wherein the configurable degeneration inductor comprises:
   a first inductor coupled between the gain transistor and a particular node;
   a second inductor coupled between the particular node and circuit ground; and
   a shunt transistor coupled between the particular node and ground.

5. The apparatus of claim 1, wherein the first transistor is configured to receive the amplified signal and to provide a first output signal, and wherein the second transistor is configured to receive the amplified signal and to provide a second output signal.

6. The apparatus of claim 1, wherein one of the first transistor and the second transistor is configured to be enabled based on the first operating mode, and wherein the first transistor and the second transistor are configured to be enabled based on the second operating mode.

7. The apparatus of claim 1, further comprising:
   a second gain transistor configured to receive the input signal;
   a third transistor coupled to the second gain transistor; and
   a fourth transistor coupled to the second gain transistor, wherein one of the first transistor, the second transistor, the third transistor, and the fourth transistor is configured to provide the single output signal based on the first operating mode, and wherein at least two of the first transistor, the second transistor, the third transistor, and the fourth transistor are configured to provide the plurality of output signals based on the second operating mode.

8. The apparatus of claim 7, wherein a first source of the gain transistor and a second source of the second gain transistor are coupled together and coupled to the configurable degeneration inductor.

9. The apparatus of claim 1, further comprising:
   a second gain transistor configured to receive a second input signal;
   a third transistor coupled to the second gain transistor;
   a fourth transistor coupled to the second gain transistor, wherein one of the first transistor, the second transistor, the third transistor, and the fourth transistor is configured to provide the single output signal based on the first operating mode, and wherein at least two of the first transistor, the second transistor, the third transistor, and the fourth transistor are configured to provide the plurality of output signals based on the second operating mode; and a second configurable degeneration inductor coupled to the second gain transistor and configured to provide a third source degeneration inductance based on the first operating mode and to provide a fourth source degeneration inductance based on the second operating mode.

10. The apparatus of claim 1, wherein the gain transistor is configured to be biased by a first bias current based on the first operating mode and to be biased by a second bias current based on the second operating mode, the second bias current exceeding the first bias current.

11. The apparatus of claim 10, wherein a first variable gain of the gain transistor is based on the first bias current, wherein a second variable gain of the gain transistor is based on the second bias current, and wherein the first bias current, the second bias current, or both, are adjustable.

12. The apparatus of claim 1, further comprising:
an input matching circuit coupled to the gain transistor and configured to receive an input radio frequency (RF) signal and to provide the input RF signal to the gain transistor.

13. The apparatus of claim 12, wherein the input matching circuit comprises an inductor coupled between an input of the input matching circuit and an output of the input matching circuit.

14. A method of signal amplification comprising:
amplifying an input signal based on a first source degeneration inductance and generating a single output signal based on a first operating mode; and
amplifying the input signal based on a second source degeneration inductance and generating a plurality of output signals based on a second operating mode.

15. The method of claim 14, further comprising:
providing the first source degeneration inductance via a first inductor; and
providing the second source degeneration inductance via a parallel combination of the first inductor and a second inductor.

16. The method of claim 14, further comprising:
providing the first source degeneration inductance via a series combination of a first inductor and a second inductor; and
providing the second source degeneration inductance via the first inductor.

17. The method of claim 14, further comprising:
amplifying a second input signal based on a third source degeneration inductance based on the first operating mode to provide a second amplified signal; and
amplifying the second input signal based on a fourth source degeneration inductance based on the second operating mode to provide a second amplified signal, wherein the single output signal or at least one output signal of the plurality of output signals is based on the second amplified signal.

18. An apparatus comprising:
means for amplifying an input signal to provide an amplified signal;
means for providing a first source degeneration inductance based on a first operating mode and for providing a second source degeneration inductance based on a second operating mode;
means for selectively providing a first output signal based on the amplified signal, the means for selectively providing the first output signal coupled to the means for amplifying; and
means for selectively providing a second output signal based on the amplified signal, the means for selectively providing the second output signal coupled to the means for amplifying.

19. The apparatus of claim 18, wherein the means for providing the first source degeneration inductance and for providing the second source degeneration inductance comprises:
means for providing a first inductance coupled between a first node and ground, the first node coupled to the means for amplifying the input signal;
means for providing a second inductance coupled between the first node and a second node; and
means for shunting the second node to ground.

20. The apparatus of claim 18, further comprising:
means for amplifying a second input signal to provide a second amplified signal; and
means for providing a third source degeneration inductance based on the first operating mode and for providing a fourth source degeneration inductance based on the second operating mode.

* * * * *